(12) United States Patent
Yoshihara

(10) Patent No.: US 7,327,126 B2
(45) Date of Patent: Feb. 5, 2008

(54) DIODE CIRCUIT

(75) Inventor: Toshio Yoshihara, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 180 days.

(21) Appl. No.: 11/176,296

(22) Filed: Jul. 8, 2005

(65) Prior Publication Data

US 2006/0012401 A1 Jan. 19, 2006

(30) Foreign Application Priority Data

Jul. 15, 2004 (JP) ............................. 2004-208200

(51) Int. Cl.
*G05F 1/00* (2006.01)
(52) U.S. Cl. ...................... 323/271; 323/282; 326/82; 326/33; 327/538
(58) Field of Classification Search ................ 327/538; 330/254, 261; 323/271, 282
See application file for complete search history.

(56) References Cited

U.S. PATENT DOCUMENTS 4,532,479 A * 7/1985 Blauschild ................. 330/261
4,560,947 A * 12/1985 Frey ........................... 330/254
5,481,129 A * 1/1996 DeJong et al. .............. 257/360
7,064,529 B2 * 6/2006 Telecco ....................... 323/267
7,148,741 B2 * 12/2006 Berger et al. ............... 327/538

FOREIGN PATENT DOCUMENTS

JP  2000-92824 A  3/2000

* cited by examiner

*Primary Examiner*—Rexford Barnie
*Assistant Examiner*—Crystal L Hammond
(74) *Attorney, Agent, or Firm*—Foley & Lardner LLP

(57) ABSTRACT

A diode circuit includes a differential circuit having a first MOS transistor whose source is connected to a first input terminal, a second MOS transistor whose source is connected to a second input terminal and gate and drain are connected to a gate of the first MOS transistor, and a first resistive load connected to a drain of the first MOS transistor, and a third MOS transistor whose conductive state is controlled according to an output of the differential circuit.

19 Claims, 4 Drawing Sheets

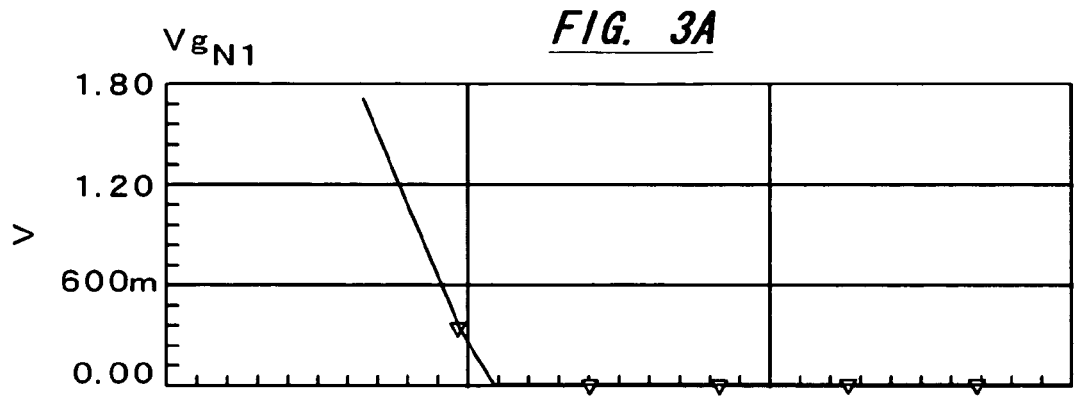
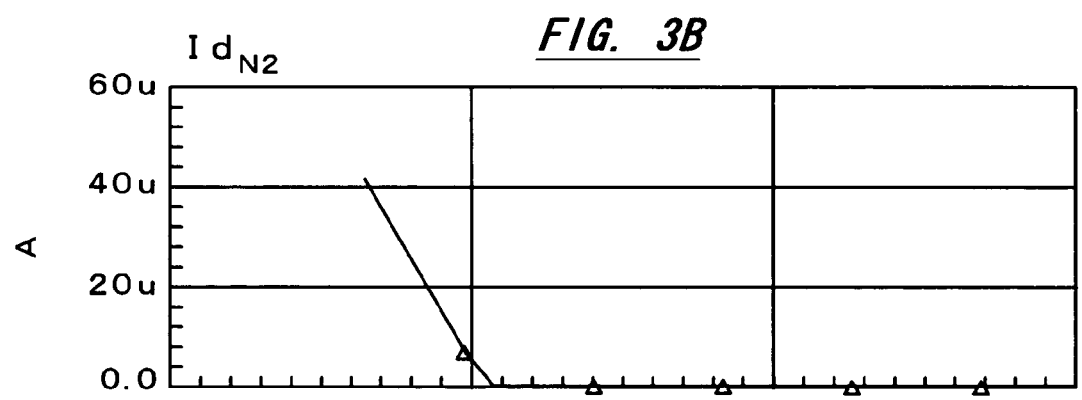
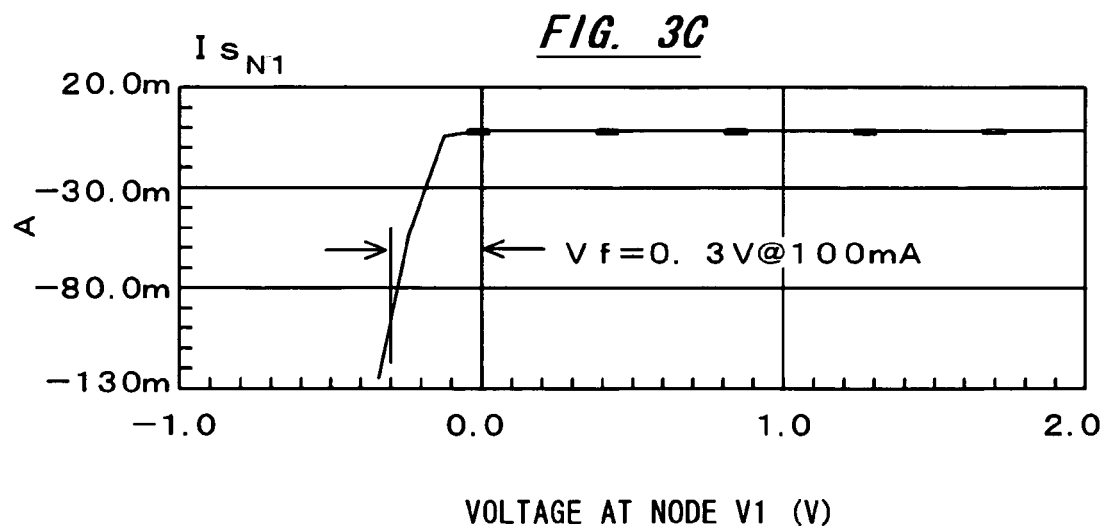

DIODE CIRCUIT

BACKGROUND OF THE INVENTION

1. Field of the Invention

The present invention relates to integrated circuits and, particularly, to a diode circuit that operates according to a voltage difference between two points in the circuit.

2. Description of Related Art

Devices using an integrated circuit have lower and lower voltage power supply. The trend toward a decrease in power supply voltage raises the need for a circuit to convert a voltage in a device. Known as a circuit used for part of the voltage conversion is a switching regulator as shown in FIG. 6. In this switching regulator, a control circuit 51 controls the pulse applied to a PMOS transistor P51. The output voltage is adjusted by the pulse control and by use of the characteristics of a schottky diode 52. In the switching regulator, the PMOS transistor P51 turns on if the voltage at an output node V52 is lower than a target voltage; it turns off if the voltage at the output node V52 is higher than a target voltage.

In the circuit of FIG. 6, the voltage at a node V51 can fall below a ground voltage Vss due to electromotive force of a coil in a smoothing circuit 53. In this case, a current flows from the ground voltage Vss to the node V51 through the schottky diode 52.

A technique described in Japanese Unexamined Patent Publication No. 2000-92824 uses a voltage comparator, a logic gate and a switch instead of the schottky diode of the circuit of FIG. 6.

A schottky diode is provided as an external component, which hinders miniaturization of an integrated circuit. The technique described in Japanese Unexamined Patent Publication No. 2000-92824 uses the voltage comparator and the logic gate so as to generate a signal according to a comparison result of the ground voltage and the voltage at the node V51. Since the switch operates according to this signal, this technique has a problem of a large circuit scale.

SUMMARY OF THE INVENTION

According to an aspect of the invention, there is provided a diode circuit which includes a differential circuit having a first MOS transistor whose source is connected to a first input terminal, a second MOS transistor whose source is connected to a second input terminal and gate and drain are connected to a gate of the first MOS transistor, and a first resistive load connected to a drain of the first MOS transistor; and a third MOS transistor whose conductive state is controlled according to an output of the differential circuit. This configuration provides a integrable diode circuit.

BRIEF DESCRIPTION OF THE DRAWINGS

The above and other objects, advantages and features of the present invention will be more apparent from the following description taken in conjunction with the accompanying drawings, in which:

FIG. 3A shows a voltage applied to the gate of an NMOS transistor N1;

FIG. 3B shows a drain current flowing from a supply voltage Vdd to a PMOS transistor P2;

FIG. 3C shows a current flowing from a second input terminal to a first input terminal;

PREFERRED EMBODIMENT OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
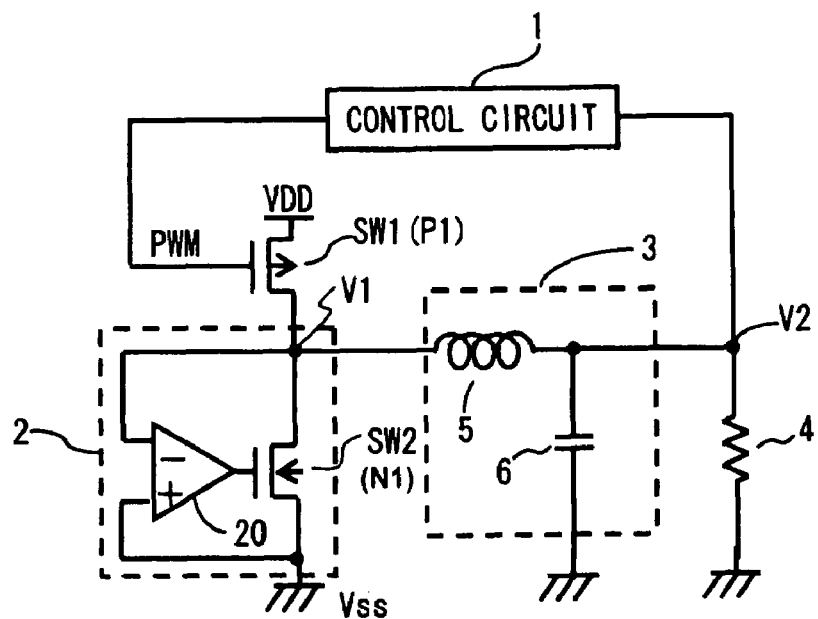
FIG. 1 shows a switching regulator of the present invention.

The present invention is described hereinafter in detail with reference to the drawings. FIG. 1 is a frame format of a switching regulator formed by using a diode circuit of the present invention. The circuit of FIG. 1 is generally called a step-down switching regulator. The step-down switching regulator has a control circuit 1, switches SW1 and SW2, a comparator 20, a smoothing circuit 3, and a load circuit 4. The control circuit 1 performs feedback control and outputs a control signal PWM so that a voltage at an output node V2 reaches a target voltage. The control circuit 1 generates an "L" level signal when the voltage at the output node V2 is lower than the target voltage and supplies it to the switch SW1.

The switch SW1 is a PMOS transistor P1 connected between the supply voltage Vdd and a node V1. The gate electrode of the PMOS transistor P1 receives the control signal PWM. The PMOS transistor P1 turns on when the control signal PWM is "L".

The switch SW2 and the comparator 20 constitute a diode circuit 2. The comparator 20 compares the voltage at the node V1 with the ground voltage Vss and outputs a comparison result signal of a level corresponding to the comparison result. The switch SW2 is an NMOS transistor N1 connected between the ground voltage Vss and the node V1. The gate of the NMOS transistor N1 receives the comparison result signal from the comparator 20. In the diode circuit 2, the NMOS transistor N1 becomes conductive when the voltage at the node V1 is lower than the ground voltage Vss; on the other hand, the NMOS transistor N1 becomes non-conductive when the voltage at the node V1 is equal to or higher than the ground voltage Vss. The operation of the comparator 20 and the NMOS transistor N1 is equal to the operation of a diode whose anode is connected to the ground voltage Vss and cathode is connected to the node V1. The diode circuit 2 is detailed later.

The smoothing circuit 3 smooths the voltage at the node V1. The smoothing circuit 3 has a known configuration, which includes a coil 5 and a capacitor 6. The load circuit 4 is a given load supplied with a voltage from the node V2. FIG. 1 illustrates the load circuit 4 as a resistor.

In the circuit of FIG. 1, if the voltage at the node V2 is lower than a target voltage, the control circuit 1 outputs a control signal PWM of "L" level. When the control signal PWM is "L" level, the PMOS transistor P1 turns on. Since the PMOS transistor P1 is on, a first supply voltage Vdd is electrically connected to the node V1.

On the other hand, if the voltage at the node V2 is higher than a target voltage, the control circuit 1 outputs a control signal PWM of "H" level. When the control signal PWM is "H" level, the PMOS transistor P1 turns off. The diode circuit 2 operates as follows. If the voltage at the node V1 is lower than the ground voltage Vss, the NMOS transistor N1 turns on. Since the NMOS transistor is on, the ground voltage Vss, which is a second supply voltage, is electrically connected to the node V1. If, on the other hand, the voltage at the node V1 is higher than the ground voltage Vss, the NMOS transistor N1 turns off. Since the NMOS transistor is off, the ground voltage Vss is electrically isolated from the node V1.

In the switching regulator circuit of the first embodiment, a rectangular output signal appears at the node V1 by the above operation. The smoothing circuit 3 smooths the output signal. The smoothed signal is supplied to the load circuit 4 through the node V2.

Figure 2:
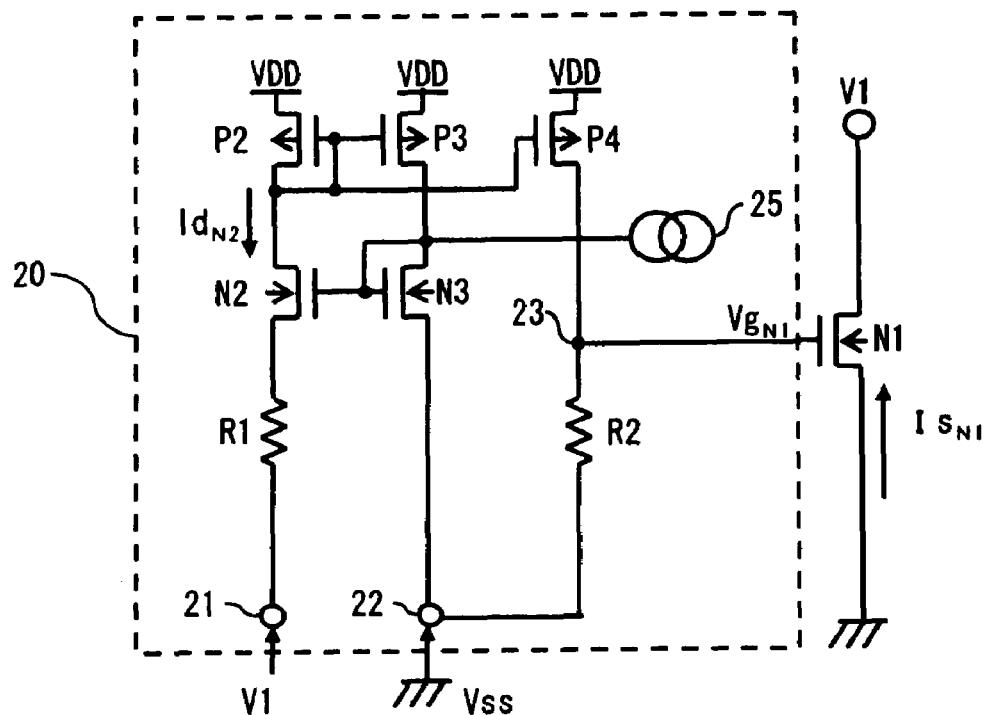
FIG. 2 shows a diode circuit of a first embodiment.

The diode circuit 2 is described in detail below. FIG. 2 is a circuit diagram of the comparator 20 and the NMOS transistor N1.

As shown in FIG. 2, the comparator 20 has a first input terminal 21, a second input terminal 22, an output terminal 23, a starter circuit 25, PMOS transistors P2, P3, and P4, NMOS transistors N2 and N3, and resistors R1 and R2. Though the starter circuit 25 is included in the comparator 20 in FIG. 2, it is not necessarily included therein. If the comparator 20 does not have the starter circuit 25, it may receive a start signal from another circuit.

The first input terminal 21 is connected to the node V1 shown in FIG. 1. The second input terminal 22 is connected to the ground voltage Vss. The PMOS transistor P2, the NMOS transistor N2, and the resistor R1 are connected in series between the supply voltage Vdd and the first input terminal 21. The PMOS transistor P3 and the NMOS transistor N3 are connected in series between the supply voltage Vdd and the second input terminal 22. The PMOS transistor P4 and the resistor R2 are connected in series between the supply voltage Vdd and the second input terminal 22.

The connection of the components is detailed below. The source of the PMOS transistor P2 is connected to the supply voltage Vdd, and the drain is connected to the drain of the NMOS transistor N2. The gate of the PMOS transistor P2 is connected to its drain. The source of the PMOS transistor P3 is connected to the supply voltage Vdd, and the drain is connected to the drain of the NMOS transistor N3. The gate of the PMOS transistor P3 is connected to the gate and drain of the PMOS transistor P2. The PMOS transistors P2 and P3 constitute a current mirror whose gates are commonly connected. The source of the PMOS transistor P4 is connected to the supply voltage Vdd, and the drain is connected to the resistor R2. The gate of the PMOS transistor P4 is connected to the gate and drain of the PMOS transistor P2. The PMOS transistors P2 and P4 also constitute a current mirror whose gates are commonly connected.

The source of the NMOS transistor N2 is connected to the resistor R1, and the drain is connected to the drain of the PMOS transistor P2. The gate of the NMOS transistor N2 is connected to the starter circuit 25. The source of the NMOS transistor N3 is connected to the ground voltage Vss through the input terminal 22, and the drain is connected to the drain of the PMOS transistor P3. The gate of the NMOS transistor N3 is connected to its drain and the starter circuit 25.

The resistor R1 is connected between the source of the NMOS transistor N2 and the first input terminal 21. The resistor R2 is connected between the drain of the PMOS transistor P4 and the second input terminal 22.

The output terminal 23 of the comparator 20 having the above configuration is a node 23 between the PMOS transistor P4 and the resistor R2. The gate of the NMOS transistor N1, which is the switch SW2, receives the output of the comparator 20. The source of the NMOS transistor N1 is connected to the ground voltage Vss and the drain is connected to the node V1 shown in FIG. 1.

The operation of the circuit having the comparator 20 and the NMOS transistor N1 is described below. FIGS. 3A to 3C are graphs showing a change in voltage/current when the second input terminal 22 is the ground Vss and the voltage applied to the first input terminal 21 is changed. FIG. 3A shows the voltage applied to the gate of the NMOS transistor N1. FIG. 3B shows the drain current flowing from the supply voltage Vdd to the PMOS transistor P2. FIG. 3C shows the current flowing from the second input terminal 23 to the first input terminal 22.

In the circuit configured as above, the drain and the gate of the NMOS transistor N3 are connected to each other. Thus, a voltage difference between the source and the drain of the NMOS transistor N3 is a threshold voltage Vth of the NMOS transistor N3. The gate of the NMOS transistor N2 receives a voltage equivalent to a sum of the source voltage and the threshold voltage Vth of the NMOS transistor N3. Since the NMOS transistors N2 and N3 are designed to have the same characteristics, their threshold voltages Vth are the same. Since the voltage input to the second input terminal 22 is a ground voltage, the threshold voltages Vth is applied to the gate of the NMOS transistor N2.

In this condition, if the voltage applied to the first input terminal 21 (the voltage at the node V1) falls below the ground voltage Vss, that is, when a current flows rightward in the coil of the smoothing circuit in FIG. 1, the source voltage of the NMOS transistor N2 decreases accordingly. Therefore, a gate-to-source voltage $Vgs_{N2}$ of the NMOS transistor N2 exceeds the threshold voltage Vth. As a result, a current $Id_{N2}$ flowing from the supply voltage Vdd to the first input terminal 21 through the PMOS transistor P2, the NMOS transistor N2, and the resistor R1 is generated (see FIG. 3B).

When the current flows through the PMOS transistor P2, the current flows also through the PMOS transistor P4 which constitutes a current mirror with the PMOS transistor P2. Voltage drop thereby occurs due to the resistor R2. Thus, the voltage at the output terminal 23 rises by just that much.

Due to the voltage drop by the resistor R2, the gate voltage $Vg_{N1}$ of the NMOS transistor N1 rises (see FIG. 3A). Since the drain of the NMOS transistor N1 is connected to the node V1, the gate-to-drain voltage $Vgd_{N1}$ of the NMOS transistor N1 rises accordingly.

Generally in MOS transistors, a source and a drain have the same structure. Therefore, if the $Vgd_{N1}$ is higher than the threshold voltage of the NMOS transistor N1, the NMOS transistor N1 turns on. Thus, the drain of the NMOS transistor N1 operates as a source. Since the voltage at the node V1 is lower than the ground voltage Vss, a current $Is_{N1}$ flows from the source (ground voltage side) to the drain (node V1 side) of the NMOS transistor N1 in this case (see FIG. 3C).

On the other hand, if the voltage at the node V1 exceeds the ground voltage Vss, the gate-to-source voltage of the NMOS transistor N2 falls below the threshold voltage Vth. The NMOS transistor N2 thereby turns off. Since a current stops flowing through the PMOS transistor P2 and the NMOS transistor N2 (see FIG. 3B), no current flows through the PMOS transistor P4. As a result, the voltage applied to the gate of the NMOS transistor N1 drops (see FIG. 3A). If the voltage at the output terminal 23 falls below the threshold voltage of the NMOS transistor N1, the NMOS transistor N1 turns off. Hence, no current flows between the node V1 and the ground voltage (see FIGS. 3A and 3C).

In the comparator 20 described above, the gates of the transistors N2 and N3 are connected to the starter circuit 25. In a series of operation, the starter circuit 25 operates to stabilize the initial gate voltage of the NMOS transistors N2 and N3. For example, if the gate voltage of the NMOS transistors N2 and N3 is the ground voltage Vss at the start of the circuit, the comparator 20 does not operate unless the voltage applied to the first input terminal 21 falls below −Vth. However, by applying a given voltage to the gates of the NMOS transistors N2 and N3 when starting the circuit, it stabilizes the operation at the start of the circuit. The voltage maybe applied only at the start or applied periodically at an interval for stable operation.

In sum, the comparator 20 is a differential circuit in which the sources of the NMOS transistors N2 and N3 serve as a differential input pair and the PMOS transistors P2 and P3 serve as resistive loads. If a voltage lower than the voltage at the second input terminal is applied to the first input terminal, the differential circuit (comparator 20) outputs a signal to turn on the NMOS transistor N1.

Though a differential input is generally applied to a gate, it is applied to the sources of the NMOS transistors N2 and N3 in the first embodiment. If a differential input terminal is a gate, high-speed circuit operation requires more current flowing through the NMOS transistors N2 and N3. Making the size (gate width W) of the NMOS transistors N2 and N3 larger for high-speed operation results in an increase in gate capacity. The increase in gate capacity hinders high-speed operation. To overcome this drawback, the present invention applies a differential input to the sources of the NMOS transistors N2 and N3, thereby achieving a high-speed differential circuit without being affected by gate capacity.

Generally, the output of a differential input pair is a node between the transistors forming a differential input pair and the resistive loads. In this invention as well, it is possible to make a configuration where a node between the NMOS transistor N3 and the PMOS transistor P3 is the output of the differential circuit, and the output is applied to the gate of the NMOS transistor N1. In this configuration, the same operation as in the first embodiment is possible by adjusting the size and balance of the transistors extremely accurately.

The first embodiment forms the output terminal 23 of the differential circuit by using the PMOS transistor P4 constituting a current mirror. The voltage applied to the gate of the NMOS transistor N1 corresponds to a voltage drop by the resistor R2. By adjusting the resistance value of the resistor R2, it is possible to turn on the NMOS transistor N1 in accordance with the output of the differential circuit. The first embodiment allows adjustment of component balance relatively easily.

The resistor R1 is connected between the first input terminal and the NMOS transistor N2. The resistor R1 prevents the current in the comparator 20 flowing from the supply voltage Vdd to the node V1 from being excessive.

The first input terminal of the comparator 20 and the drain of the NMOS transistor N1 are both connected to the node V1. Further, the second input terminal of the comparator 20 and the source of the NMOS transistor N1 are both connected to the ground. From this point of view, the circuit of FIG. 2 is the same as the circuit of FIG. 4. If the first input terminal 21 of the comparator 20 is a cathode terminal and the second input terminal 22 of the comparator 20 is an anode terminal, the comparator 20 and the NMOS transistor N1 are the circuit that operates equivalently to a diode.

Figure 4:
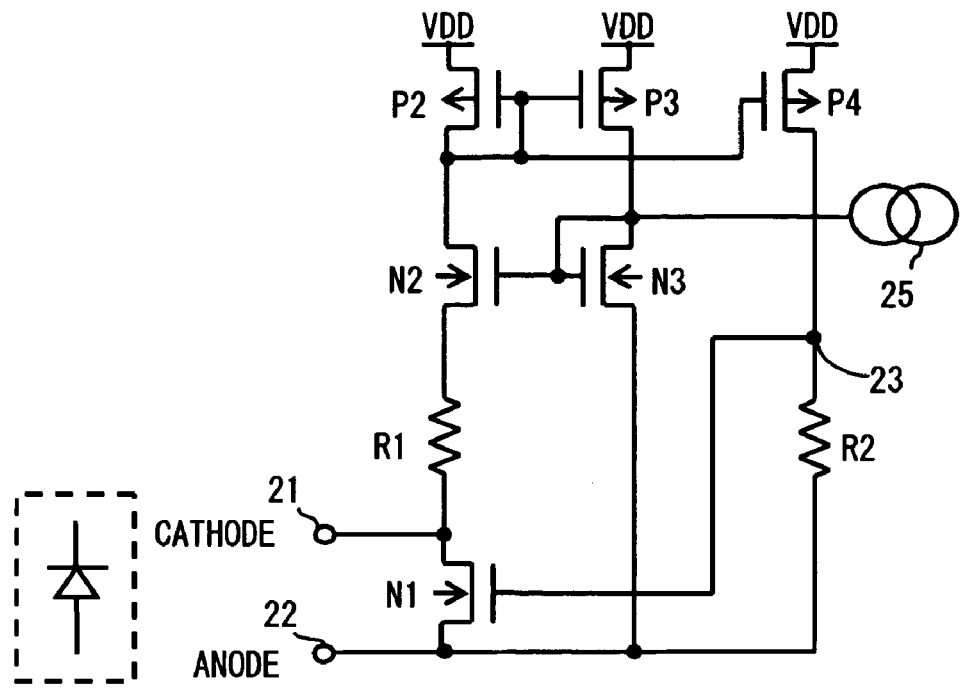
FIG. 4 shows a circuit of FIG. 2 in another form.

The first embodiment forms a switching regulator by using the diode circuit 2 as shown in FIG. 4, thereby making an integrated circuit without using an external schottky diode.

Compared to a conventional configuration using a comparator and a logic gate, this invention allows circuit size reduction. Since this invention uses a source as a differential input terminal of a comparative voltage, it allows high-speed operation in response to a change in input voltage. Therefore, the diode circuit 2 of the present invention is applicable to a low-power switching regulator such as a mobile phone of low power. Furthermore, having a current mirror configuration where a current flows according to a voltage change in the first input terminal 21, the present invention controls on/off of the NMOS transistor N1 by using a voltage drop in the resistor R2; therefore, it is possible to ensure the operation by setting a resistance value of the resistor R2.

Second Embodiment

Figure 5:
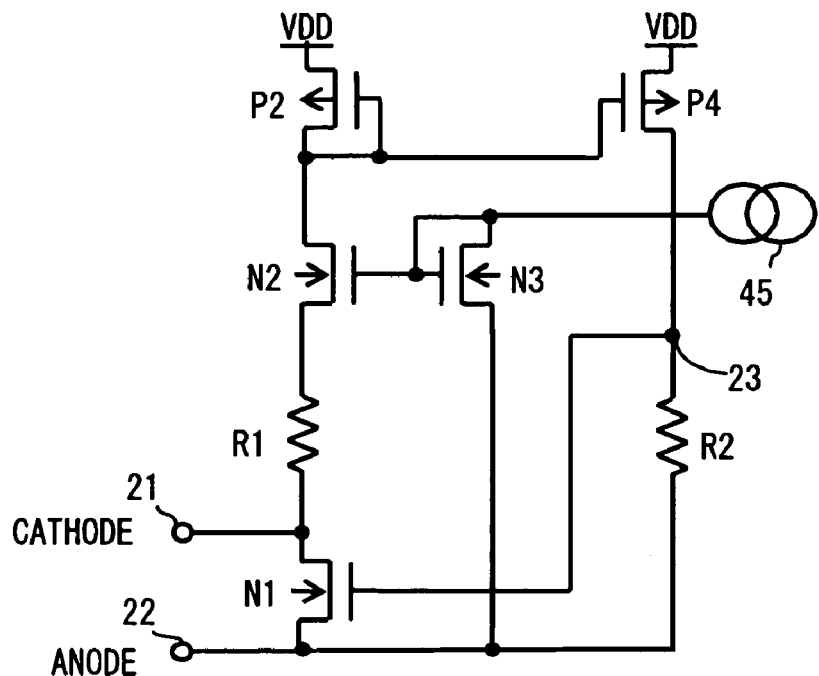
FIG. 5 shows a diode circuit of a second embodiment.
Figure 6:
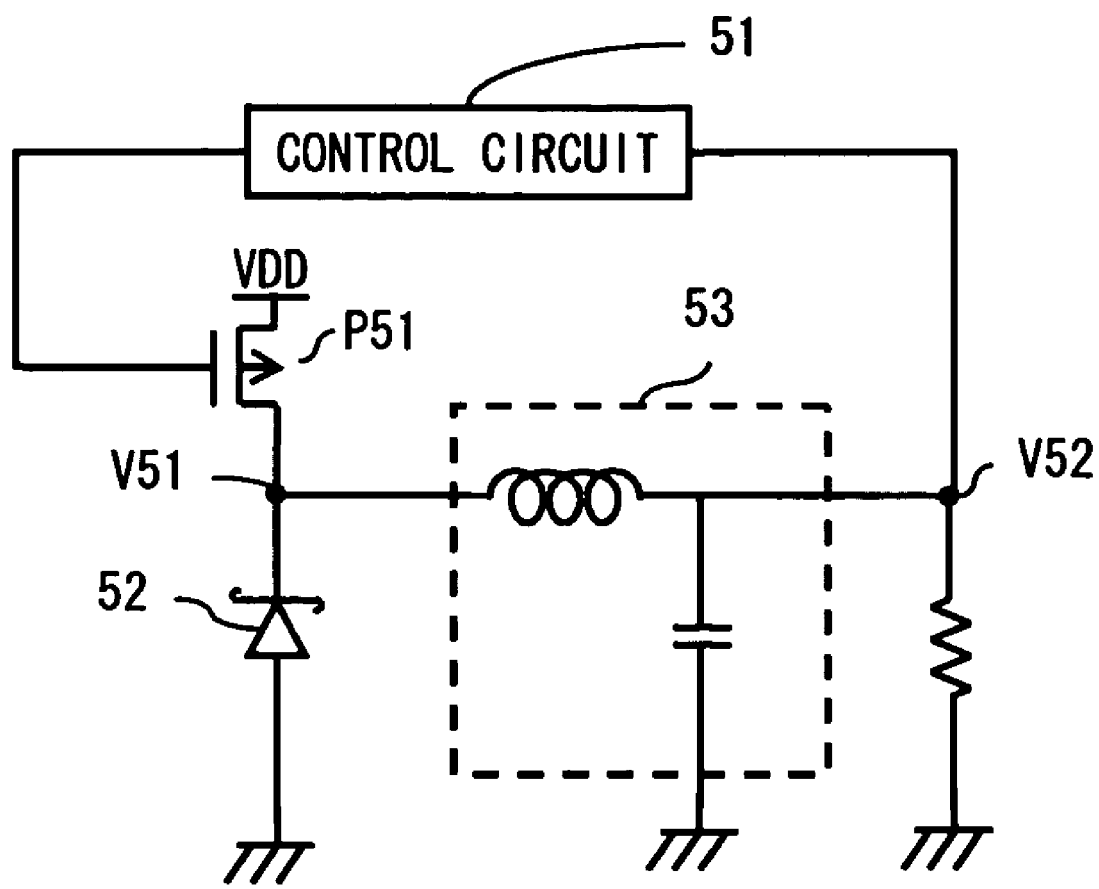
FIG. 6 is a conventional switching regulator.

FIG. 5 is a circuit diagram showing an equivalent diode circuit according to the second embodiment of the invention. The second embodiment forms a diode circuit where the configuration of the comparator 20 is different from that of FIG. 2. In FIG. 5, the same reference symbols as in FIGS. 2 and 4 designate the same elements and redundant description is omitted.

The circuit of FIG. 5 has the NMOS transistors N1, N2 and N3, and the PMOS transistors P2 and P4, and the resistors R1 and R2 which are the same as those in the circuit of FIGS. 2 and 4. The circuit of the second embodiment does not have the PMOS transistor P3 of FIGS. 2 and 4. The gate and drain of the NMOS transistor N3 are connected to a bias circuit 45 but not to the power supply voltage Vdd.

The circuit of FIG. 4 operates in the same way as in the first embodiment if the second input terminal receives a ground voltage and the first input terminal receives a lower voltage than the ground voltage. In the second embodiment, however, the gate of the NMOS transistor N2 and the gate and drain of the NMOS transistor N3 are connected to the bias circuit 45. The bias circuit 45 generates a given fixed voltage after the start of the circuit. Since the gate voltage of the NMOS transistors N2 and N3 is determined according to the fixed voltage, the voltage at the node V1 (input terminal 21) changes after a current starts flowing through the NMOS transistor N2. The fixed voltage is set so as to apply an optimal voltage in consideration of a response time and current of the comparator 20.

In this configuration, the voltage most suitable for operation speed is always biased to the gates of the NMOS transistors N2 and N3, and it is thereby possible to respond to a voltage change at the first input terminal 21 more quickly.

As described in the foregoing, the present invention allows formation of a small integrable diode circuit. Further, since a differential input terminal is a source electrode, it enables high-speed operation. The diode circuit of the present invention may be thus used as a diode circuit of a switching regulator of a DC-DC converter used in a low power system.

Though the embodiments of the invention are described in detail in the foregoing, the diode circuit of the present invention is not restricted to be applied to a switching regulator, but may be used in various application as a diode circuit.

It is apparent that the present invention is not limited to the above embodiment, that may be modified and changed without departing from the scope and spirit of the invention.

What is claimed is:

1. A circuit comprising:
    a first transistor connected between an input node and a first power supply line, and having a control terminal connected to a first node;
    a comparator connected among the input node, the first power supply line and the first node, comparing a voltage of the input node with a voltage of the first power supply line and outputting a result of voltage comparison to the first node for increasing the voltage of the input node during the voltage of the input node being lower than a predetermined voltage.

2. The circuit according to claim 1, wherein the comparator includes a second transistor connected between the first node and a second power supply line and having a control terminal connected to a second node which is receiving a voltage based on the voltage of the input node, the second transistor being in conduction state for electrically conducting the first transistor during the voltage of the input node being lower than a predetermined voltage.

3. The circuit according to claim 2, wherein the comparator further includes a third transistor connected between the second power supply line and the second node and having a control terminal connected to the second node.

4. The circuit according to claim 3, wherein the comparator further includes a fourth transistor connected between the second power supply line and a third node and having a control terminal connected to the second node.

5. The circuit according to claim 4, wherein the comparator further includes a fifth transistor connected between the second node and a fourth. node which is receiving a voltage based on the voltage of the input node and having a control terminal connected to the third node.

6. The circuit according to claim 5, wherein the comparator further includes a sixth transistor connected between the third node and the first power supply line and having a control terminal connected to the third node.

7. The circuit according to claim 6, wherein the comparator further includes a first resistor connected between the fourth node and the input node.

8. The circuit according to claim 7, wherein the comparator further includes a second resistor connected between the first node and the first power supply line.

9. The circuit according to claim 8, further comprising a smoothing circuit connected between the input node and an output node.

10. The circuit according to claim 9, wherein the smoothing circuit including an inductor connected between the input node and the output node and a capacitor connected between the output node and the first power supply line.

11. The circuit according to claim 10, further comprising a load circuit connected to the capacitor in parallel.

12. The circuit according to claim 11, further comprising:
    a seventh transistor connected between the input node and the second power supply line and having a control terminal;
    a control circuit connected between the output node and the control terminal of the seventh transistor and controlling a control conductive state of the seventh transistor in accordance with the voltage of the output node.

13. The circuit according to claim 1, wherein the predetermined voltage is the voltage of the first power supply line.

14. The circuit according to claim 1, wherein the voltage of the first power supply line is a ground voltage.

15. The circuit according to claim 1, wherein the first transistor is field effect transistor.

16. The circuit according to claim 1, wherein the first transistor is metal-oxide-semiconductor field effect transistor.

17. The circuit according to claim 4, wherein the comparator includes a starter circuit connected to the third node and supplying a starter voltage to the third voltage.

18. The circuit according to claim 2, wherein conductive type of the first transistor is different from conductive type of the second transistor.

19. The circuit according to claim 2, wherein the first transistor is a metal-oxide-semiconductor (MOS) transistor having n-conductive type and the second transistor is a MOS transistor having p-conductive type.

* * * * *